March 2, 1971 N. CHAND 3,567,447

PROCESS FOR MAKING MASKS PHOTOGRAPHICALLY

Filed July 3, 1967

INVENTOR
NIRMAL CHAND

BY J. B. Kraft
ATTORNEY

United States Patent Office 3,567,447
Patented Mar. 2, 1971

3,567,447

PROCESS FOR MAKING MASKS PHOTOGRAPHICALLY

Nirmal Chand, South Burlington, Vt., assignor to International Business Machines Corporation, Armonk, N.Y.

Filed July 3, 1967, Ser. No. 650,804
Int. Cl. G03c *5/00*
U.S. Cl. 96—36 21 Claims

ABSTRACT OF THE DISCLOSURE

A process of producing masks photographically by forming a developed colloidal silver image in a gelatin coating on a glass plate and heating the coating, after which the non-image areas of the coating are selectively removed by a gelatin removing liquid such as aqueous sodium hypochlorite. The heating renders the silver image areas of the gelatin coating more resistant to the action of the gelatin removing liquid so that the non-image areas may be selectively removed.

BACKGROUND OF INVENTION

(1) Field of invention

Figure 1:
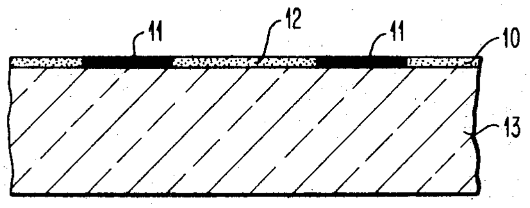

This invention relates to a photographic process for making masks, particularly masks which are to be used in the exposure of photosensitive polymeric coatings or photoresists in the fabrication of microelectronic semiconductor devices such as integrated circuits or individual components, e.g. transistors. The semiconductor device art has been continuously miniaturizing its components and circuits in order to achieve low cost, durable units capable of performing electronic functions at very high speeds. These elements are fabricated in large numbers simultaneously. Between 100 and 500 integrated circuit units can be fabricated simultaneously on a silicon wafer which is about 1 inch in diameter and less than 1/100 of an inch thick. In these simultaneous fabrication approaches, it is necessary to perform various fabrication processes such as impurity diffusion, epitaxial growth and metallization in minute selected areas over the entire wafer without affecting the remaining area on the wafer. In order to define the minute areas at which a particular fabrication step is to be performed, photosensitive polymeric coatings or photoresists are coated over the wafer and exposed to ultraviolet light through a contact mask to produce an exposure pattern after which the minute areas which are to be processed in the given fabrication step are uncovered by removing photoresist and etching, and the remaining areas are left covered by the photoresist.

At least one individual mask is required for each step in semiconductor fabrication. These masks are produced by photographic techniques including high resolution photographic techniques. The multiple pattern of minute images forming a mask for a one inch diameter wafer is reduced and replicated photographically by high resolution, low distortion lenses from master drawings that are usually two or three feet across to minimize drafting irregularities.

(2) Prior art

In accordance with existing practice in the art, the masks are prepared by the exposure of conventional high resolution photographic plates, e.g., silver halide emulsions in gelatin coated on transparent substrates such as glass to the reduced images of the master drawings. The mask is required to have a very high resolution in the order of 400 line pairs per millimeter. The exposed plates are then developed and fixed in the conventional photographic manner to provide masks having an opaque or black silver image pattern in the gelatin coating with the non-image areas containing transparent gelatin. The principal aspects of photographic mask fabrication are described on pp. 150–154 of the text "Integrated Circuits, Design Principles and Fabrication" edited by R. M. Warner, Jr. (McGraw-Hill, 1965).

A problem which has hampered the photographic masking art in the fabrication of microelectronic devices is that of defects in the gelatin. Because of the size and complexity of the structures, there is very little tolerance for defects, even of microscopic size. Any defect in the transparent area of the mask may lead to broken circuit or a short circuit in the device being fabricated. Some of the possible defects in the gelatin are gel slugs, glass chips, emulsion chips and lint-like particles. While the art has taken great care to maintain the gelatin as free from defects as possible, even minimal defects have been the source of production problems. A considerable amount of time and effort is expended during mask production in inspecting and monitoring the gelatin emulsions for harmful defects. Now, with the need for even greater miniaturization of the devices, the tolerance for gelatin defects in advance device fabrication procedures has become virtually nil.

The present invention solves this problem by a fabrication process yielding a high resolution mask in which the gelatin has been eliminated from the non-masked or transparent areas without impairment of the mask resolution.

The only process in the prior art involving the removal of the gelatin from the non-image areas of a photographic image is photographic tanning. In the production of printing plates and in color printing, tanning is used to produce a relief image matrix which is in turn either transferred to a metal printing plate where the matrix acts as a resist during subsequent etching of the metal printing plate or dyed with a selected color and transferred to a substrate where it represents the selected color component in a composite color print. The tanning process involves the use of developers which produce oxidation products that tan or harden the gelatin in the image areas. In the non-image areas, where there is no development, no tanning occurs. The non-image areas are then removed by hot water leaving the relief image matrix. Relief images formed by tanning process have been found to lack the resolution and image edge definition and accuracy required in photographic masks for microelectronic device fabrication.

SUMMARY OF THE INVENTION

The present invention provides a high resolution mask in which the gelatin has been eliminated from the non-image or transparent areas by a process which comprises forming a developed silver image in a conventional gelatin emulsion coating on a transparent substrate such as a glass plate. The coating is then heated to a temperature of at least 250° C. and preferably from 375° to 425° C., after which the coating is treated with a gelatin removing liquid for a period sufficient to remove the gelatin from the non-image areas but to leave the gelatin coating in the image areas intact.

For best results, the coated plate is reheated to a temperature of at least 300° C. after removal of gelatin from the non-image areas. This reheating provides a tougher and more durable masking layer.

Preferably, the gelatin removing liquid is an aqueous solution containing a hypohalite salt such as sodium hypochlorite.

In accordance with another aspect of the present invention, a chrome mask may be prepared by applying a thin layer of chrome to the gelatin image after removal of the non-image areas, and then applying a chrome removing liquid such as a chrome etch for a period sufficient to remove the chrome from the gelatin coated areas but not to impair the chrome layer on the glass substrate in remaining areas, after which a gelatin removing liquid which is non-reactive with the chrome is applied to remove the residual silver gelatin image to form a mask with a chrome pattern corresponding to the original non-image areas on the plate.

THE DRAWINGS

FIGS. 1 through 5 are cross-sectional views of a portion of a mask structure diagrammatically illustrating the steps to be followed in the fabrication of two forms of masks produced in accordance with this invention.

DESCRIPTION OF PREFERRED EMBODIMENTS

The following are examples of preferred embodiments of the present invention:

EXAMPLE 1

A commercial photographic plate, Kodak High Resolution Plate, having a layer, about 5 microns thick, of a negative gelatin emulsion of a silver halide, predominantly silver bromide and a trace of silver chloride, with a grain size in the order of 0.01 to 0.1 micron diameter coated on a glass plate, 6 microns in thickness is exposed to the image to be represented by the pattern on the mask being produced as shown in FIG. 1 with gelatin coating 10 containing image areas 11 and transparent non-image areas 12 coated on transparent glass plate 13. The image is then developed by conventional techniques such as using a developer of the developer formulation 90 g. desiccated sodium sulfite, 8 g. hydroquinone, 52.5 g. sodium carbonate, monohydrated, 5 g. potassium bromide, 2 g. p-methylaminophenol sulfate in 1500 ml. of water and fixed conventionally to form a black silver image in the gelatin emulsion layer. The plate is then heated in an oven at a temperature of 300° C. for about 1 hour. During this period, the gelatin coating in the non-image areas darkens to a transparent reddish color and the image areas assume a reflective "metallic" sheen. The plate is then immersed in a 5% aqueous solution of sodium hypochlorite for a period just sufficient to remove the gelatin from the non-image areas to provide the structure of FIG. 2. This is evidenced by the disappearance of the reddish color in the non-image areas. The time involved is about 10 minutes at room temperature. The plate is washed with water to remove the sodium hypochlorite and dried. The plate is examined microscopically and found to have no gelatin in the non-image areas. The image areas are found to have the silver image in uninterrupted coatings which are substantially intact.

These image areas which function as the masking or covering portions in the final mask retain their covering power. They have an opacity of at least 95% which is required in order for the masks to function properly. Percent opacity is equal to $$\frac{I_o - I}{I_o} \times 100$$

where $I_o$ is the intensity of the applied light and I is the intensity of the light transmitted through the masking or image portions of the mask. There is no evidence in the non-image areas of the conventional gelatin defects such as gel slugs, glass chips or lint.

Instead of the sodium hypochlorite solution, any of the following compositions may be used for gelatin removal with the same results:

an aqueous alkaline (2.5% sodium hydroxide) 5% solution of potassium permanganate;
an aqueous alkaline (2.5% sodium hydroxide) 5% solution of hydrogen peroxide;
concentrated hydrochloric acid vapors.

EXAMPLE 2

The procedure of Example 1 is repeated using the same structures, compositions and conditions except that instead of a bake at 300° C. for 1 hour, the plate is initially heated at 400° C. for about eight minutes in an oven with a circulating inert (nitrogen) atmosphere before the removal of the gelatin in the non-image areas followed by a reheating at 400° in an oven with a circulating nitrogen atmosphere after the non-image area removal. The resulting mask displays all of the properties of the mask of Example 1, and in addition is more durable than the mask of Example 1, and in addition is more durable and tougher.

EXAMPLE 3

Examples 1 and 2 may be repeated using the same procedure and conditions except that in place of the Kodak High Resolution Plate, Kodalith, Type III plate having a predominantly silver chloride emulsion in gelatin coating is used, and in place of Kodak HRP developer, Kodak D–8 developer (desiccated sodium sulfite 90 g., hydroquinone 45 g., sodium hydroxide 37.5 g., potassium bromide 30 g. in 1750 ml. of water) is used. The results are respectively very similar to those of Examples 1 and 2.

EXAMPLE 4

Figure 2:
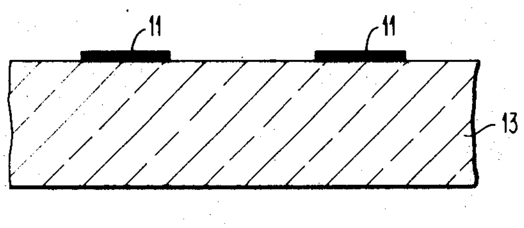
Figure 3:
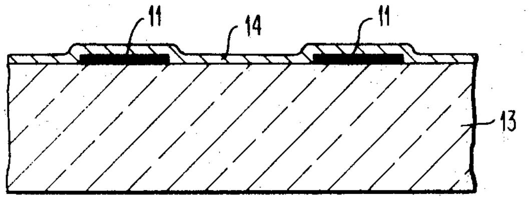
Figure 4:
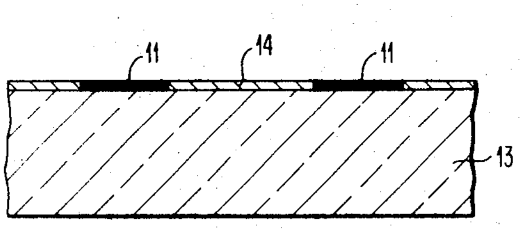
Figure 5:
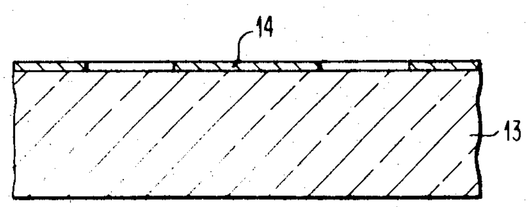

The procedure of Example 1 is repeated to provide the structure shown in FIG. 2. Then, by conventional vacuum sputtering techniques, a thin layer 14, in the order of 1000 A. thick, of chrome is applied over the plate as shown in FIG. 3. The plate is then immersed in a chrome removing liquid such as aqueous sodium hypochlorite bath for a period sufficient to remove the chrome from only the image areas. The chrome displays much greater adhesion to the glass plate in the non-image areas than to the gelatin coatings in the image areas. Therefore, the chrome is removed at a much greater rate from the gelatin than it is from the glass. The removal of the chrome from the non-image areas may be observed by the re-emergence of the dark image areas as shown in FIG. 4. The plate is then immersed in a 10% solution of nitric acid which removes the gelatin image from the image areas to provide the structure of FIG. 5 which is a chrome mask. The nitric acid solution is used instead of a sodium hypochlorite solution to remove the gelatin image because the sodium hypochlorite as previously demonstrated also removes chrome. The resulting chrome mask is utilizable in semiconductor fabrication as a high resolution mask where it of course is not hampered by gelatin imperfections.

In order to achieve the results of this invention, the plate should be heated to at least 250° C. in the initial heating step. For best results temperatures in excess of 300° C. are desirable with the temperature range of 375° C. to 425° C. being most preferable. The heating is preferably conducted in an oven having an inert atmosphere such as nitrogen. It has also been found that reheating after the removal of the gelatin from the non-image areas provides a more durable mask. The reheating step is preferably conducted within the same range of temperatures as the initial heating. The reheating may also be carried out in an oven under an inert atmosphere.

The basis for the operability of the process of the present invention resides in the selective removal of the gelatin from the non-image areas leaving the gelatin coatings in the image areas intact. The initial heating step renders the image areas much more resistant to the gelatin removing liquid than the non-image areas. Because the gelatin removal from the non-image areas is much slower, it becomes possible to remove all of the non-image areas before the covering or masking power of the image areas is affected. While some gelatin is incidentally removed from the image areas, the coatings in these image areas remain substantially intact. That is they remain continuous without interruptions in their respective image areas.

Aqueous solutions of hypohalite salts such as the hypochlorite, hypobromite and hypoiodite salts of sodium, potassium, calcium and lithium have been found to provide very suitable gelatin removing liquids in the process of this invention. In general, aqueous alkaline solutions of oxidizing agents provide good gelatin removing liquids in this process. These include the above-mentioned aqueous solutions of hypohalite salts as well as aqueous alkaline solutions of potassium permanganate and hydrogen peroxide.

While glass is the preferred material for the transparent plate, transparent plastic materials which are unaffected by the gelatin removing liquid and unaffected by the temperatures employed in the process may be used.

With respect to the aspect of the present invention related to chrome mask formation, it will be clear that other metals may be deposited in place of chrome by the same procedure. Such metals include nickel, tin, aluminum, and gold. The metals display a greater adhesion to glass than to the gelatin image areas and thus may readily be removed.

While the invention has been particularly shown and described with reference to the preferred embodiments thereof, it will be understood by those skilled in the art that various changes in form and detail may be made therein without departing from the spirit and scope of the invention.

What is claimed is:

1. A process for producing a photographic mask comprising:
 (a) forming a developed silver image in an untanned gelatin coating on a transparent substrate, said substrate having a softening point above 250° C.,
 (b) heating said coating to a temperature of at least 250° C. for a period sufficient to produce a differential solubility between image and non-image areas in the coating, and
 (c) applying a gelatin removing liquid selected from the group consisting of aqueous alkaline solutions of oxidizing agents and hydrochloric acid to the coating for a period sufficient to remove the gelatin coating from the non-image areas but to leave the gelatin coating in the image areas intact.

2. The process of claim 1 wherein the substrate is a glass plate.

3. The process of claim 2 wherein the coating is heated to a temperature in the range of 375° to 425° C.

4. The process of claim 2 wherein the mask is reheated to a temperature of at least 300° C. after the non-image area coating removal.

5. The process of claim 2 wherein the gelatin removing liquid is an aqueous alkaline solution of an oxidizing agent.

6. The process of claim 2 wherein the gelatin removing liquid is an aqueous hypohalite solution.

7. The process of claim 6 wherein said hypohalite is is hypochlorite.

8. The process of claim 4 wherein said gelatin removing liquid is an aqueous alkaline solution of an oxidizing agent.

9. The process of claim 8 wherein said solution is an aqueous hypohalite solution.

10. The process of claim 9 wherein said hypohalite is hypochlorite.

11. A process for producing a photographic mast comprising:
 (a) forming a developed silver image in an untanned gelatin coating on a glass plate,
 (b) heating the coating to a temperature of at least 250° C. for a period sufficient to produce a differential solubility between image and non-image areas in the coating,
 (c) applying a gelatin removing liquid selected from the group consisting of aqueous alkaline solutions of oxidizing agents and hydrochloric acid to the coating for a period sufficient to remove the gelatin coating from the non-image areas but to leave the gelatin coating in the image areas intact,
 (d) applying a thin layer of metal over the glass substrate,
 (e) applying a dilute metal removing solution to the metal layer for a period sufficient to remove the metal layer from the gelatin image areas but not to impair the metal layer on the glass substrate in the remaining areas, and
 (f) applying a gelatin removing liquid to the plate to remove the residual silver gelatin image, said liquid being non-reactive with the metal, to form a metal image on the glass plate corresponding to the original non-image areas.

12. The process of claim 8 wherein said metal is chrome.

13. The process of claim 12 wherein said chrome layer is applied by vacuum deposition.

14. The process of claim 12 wherein the gelatin removing liquid in step (c) is an aqueous alkaline solution of an oxidizing agent.

15. The process of claim 14 wherein said solution is an aqueous hypohalite solution.

16. The process of claim 15 wherein said hypohalite is hypochlorite.

17. The process of claim 12 wherein said chrome etching solution is an aqueous hypochlorite solution.

18. The process of claim 12 wherein the gelatin removing liquid of step (f) is nitric acid.

19. The process of claim 12 wherein the metal removal and the gelatin removal from the gelatin image areas are carried out simultaneously.

20. The process of claim 2 wherein the heating at at least 250° C. is continued until the non-image areas in the coating darken to a transparent reddish color and the image areas assume a reflective metallic sheen.

21. The process of claim 20 wherein the gelatin removing liquid is applied to the coating for a period sufficient to eliminate the reddish color in the non-image areas.

References Cited

UNITED STATES PATENTS

| | | | |
|---|---|---|---|
| 2,692,826 | 10/1954 | Neugebauer | 96—33 |
| 2,868,124 | 1/1959 | Crawford | 96—36.2 |
| 3,167,463 | 1/1965 | Patsko | 96—36.2 |

FOREIGN PATENTS

| | | | |
|---|---|---|---|
| 1,038 | 1871 | Great Britain | 96—34 |

NORMAN G. TORCHIN, Primary Examiner

J. E. CALLAGHAN, Assistant Examiner

U.S. Cl. X.R.

96—38.3